(12) United States Patent
Avouris et al.

(10) Patent No.: US 8,859,439 B1
(45) Date of Patent: Oct. 14, 2014

(54) SOLUTION-ASSISTED CARBON NANOTUBE PLACEMENT WITH GRAPHENE ELECTRODES

(71) Applicants: International Business Machines Corporation, Armonk, NY (US); Taiwan Bluestone Technology Ltd., Tainan (TW); Karlsruhe Institute of Technology, Eggenstein-Leopoldshafen (DE)

(72) Inventors: Phaedon Avouris, Yorktown Heights, NY (US); Christos Dimitrakopoulos, Baldwin Place, NY (US); Damon B. Farmer, White Plains, NY (US); Mathias B. Steiner, New York, NY (US); Michael Engel, Karlsruhe (DE); Ralph Krupke, Stutensee-Blankenloch (DE); Yu-Ming Lin, West Harrison, NY (US)

(73) Assignees: International Business Machines Corporation, Armonk, NY (US); Karlsruhe Institute of Technology (DE); Taiwan Bluestone Technology Ltd. (TW)

(*) Notice: Subject to any disclaimer, the term of this patent is extended or adjusted under 35 U.S.C. 154(b) by 12 days.

(21) Appl. No.: 13/852,798

(22) Filed: Mar. 28, 2013

(51) Int. Cl.
  *H01L 21/31* (2006.01)
  *H01L 29/06* (2006.01)
  *H01L 21/02* (2006.01)
  *B82Y 40/00* (2011.01)

(52) U.S. Cl.
  CPC ............ *H01L 29/0669* (2013.01); *B82Y 40/00* (2013.01); *H01L 21/02376* (2013.01); *Y10S 977/742* (2013.01)

USPC ........................................... 438/758; 977/742

(58) Field of Classification Search
  USPC ................................. 257/9; 438/758; 977/742
  See application file for complete search history.

(56) References Cited

U.S. PATENT DOCUMENTS

| 7,615,776 B2 * | 11/2009 | Chaudhari | ..................... 257/40 |
| 7,960,713 B2 | 6/2011 | Hunt et al. | |
| 2008/0296563 A1 | 12/2008 | Bourgoin et al. | |
| 2009/0294966 A1 | 12/2009 | Liu et al. | |
| 2011/0031389 A1 | 2/2011 | Reed et al. | |
| 2011/0284380 A1 | 11/2011 | Martin et al. | |

OTHER PUBLICATIONS

Avouris et al., "Carbon nanotube transistor employing embedded electrodes," U.S. Appl. No. 13/278,552, filed Oct. 21, 2011.

(Continued)

*Primary Examiner* — Lex Malsawma
*Assistant Examiner* — Patricia Reddington
(74) *Attorney, Agent, or Firm* — Cantor Colburn LLP; Vazken Alexanian

(57) ABSTRACT

A semiconductor device includes a substrate having at least one electrically insulating portion. A first graphene electrode is formed on a surface of the substrate such that the electrically insulating portion is interposed between a bulk portion of the substrate and the first graphene electrode. A second graphene electrode formed on the surface of the substrate. The electrically insulating portion of the substrate is interposed between the bulk portion of the substrate and the second graphene electrode. The second graphene electrode is disposed opposite the first graphene electrode to define an exposed substrate area therebetween.

11 Claims, 25 Drawing Sheets

(56) References Cited

OTHER PUBLICATIONS

L. Dong et al., "Floating-Potential Dielectrophoresis-Controlled Fabrication of Single-Carbon-Nanotube Transistors and Their Electrical Properties," J. Phys. Chem. B, vol. 109, 2005, pp. 13148-13153.

S. Jang et al., "Flexible, transparent single-walled carbon nanotube transistors with graphene electrodes," Nanotechnology, vol. 21, 2010, 425201, 5 pages.

L. Jiao et al., "Selective Positioning and Integration of Individual Single-Walled Carbon Nanotubes," Nano Lett., vol. 9, 2009, pp. 205-209.

P. Stokes et al., "High quality solution processed carbon nanotube transistors assembled by dielectrophoresis," Appl. Phys. Lett., vol. 96, 2010, 083110, 3 pages.

L. Zhang et al., "Photocatalytic Patterning and Modification of Graphene," J Am. Chem. Soc., vol. 133, No. 8, 2011, pp. 2706-2713.

\* cited by examiner

SOLUTION-ASSISTED CARBON NANOTUBE PLACEMENT WITH GRAPHENE ELECTRODES

BACKGROUND

The present invention relates to carbon nanotubes, and more specifically, to a method of depositing carbon nanotubes on a substrate.

Nanotechnology, such as carbon nanotube (CNT) technology, has proven to be effective in addressing the ongoing trend of reducing the size of semiconductor devices. In particular, nanotube-based transistors, also known as carbon nanotube field-effect transistors (CNTFETs), are capable of digital switching. Various CNT placement techniques have been developed for depositing carbon nanotubes on a substrate to form the nanotube-based transistor. These CNT deposition techniques rely on substrate patterning, chemical surface functionalization, Langmuir-Blodgett-type techniques, or a combination thereof. However, the traditional CNT deposition techniques offer little control over the position, orientation, and density of the carbon nanotubes.

Another known technique for depositing carbon nanotubes on a substrate is based on dielectrophoresis, also known as the electric-field method. The conventional electric-field method requires the presence of metallic electrodes to induce an electric field at a desired location at which to dispose the carbon nanotubes. The presence of the metallic electrodes, however, deteriorates the functionality and performance of semiconductor devices after placement of the carbon nanotubes is complete. Further, maintaining embedded metal electrodes in the substrate prevents reducing the overall size of the semiconductor device.

SUMMARY

According to an embodiment, a method of forming carbon nanotubes on a substrate includes forming a pair of graphene electrodes on a surface of the substrate. The pair of graphene electrodes includes a first graphene electrode and a second graphene electrode disposed opposite the first graphene electrode. The first and second graphene electrodes are separated from one another by an exposed portion of the substrate. The method further includes depositing a solution containing at least one carbon nanotube on the surface of the substrate. The solution covers the first and second graphene electrodes. The method further includes generating an electric field across the first and second graphene electrodes. The electric field forces the carbon nanotubes to the exposed portion of the substrate and aligns the at least one carbon nanotube between the first and second graphene electrodes in a direction parallel with the electric field.

According to another embodiment, a semiconductor device includes a substrate having at least one electrically insulating portion. A first graphene electrode is formed on a surface of the substrate such that the electrically insulating portion is interposed between a bulk portion of the substrate and the first graphene electrode. A second graphene electrode formed on the surface of the substrate. The electrically insulating portion of the substrate is interposed between the bulk portion of the substrate and the second graphene electrode. The second graphene electrode is disposed opposite the first graphene electrode to define an exposed substrate area therebetween.

According to still another embodiment, a semiconductor device comprises a substrate wafer configured to insulate electrical current from flowing therethrough. A graphene electrode network includes first and second electrode branches separated from one another by an exposed portion of the substrate wafer. The first and second electrode branches extend along the substrate in direction parallel to one another. The first electrode branch is configured to receive a voltage source and the second electrode branch is configured to receive a ground source. A plurality of carbon nanotube arrays are arranged between the first and second electrode branches. The plurality of carbon nanotube arrays includes a plurality of individual carbon nanotubes. The carbon nanotubes are aligned perpendicular to the first and second electrode branches in response to an electric field generated by applying the voltage and ground sources.

Additional features are realized through the techniques of the present disclosure. Various embodiments are described in detail herein and are considered a part of the claimed invention. For a better understanding of the invention and the features of the various embodiments, refer to the description and to the drawings.

BRIEF DESCRIPTION OF THE SEVERAL VIEWS OF THE DRAWINGS

The subject matter of the inventive concept is particularly pointed out and distinctly claimed in the claims at the conclusion of the specification. The forgoing and other features of the embodiments are apparent from the following detailed description taken in conjunction with the accompanying drawings.

FIGS. 1-20 are a series of views illustrating a method of forming carbon nanotubes on a semiconductor device according to an exemplary process flow, in which:

FIG. 1 is a cross-sectional view of a starting substrate for fabricating a carbon nanotube semiconductor device;

FIG. 2 illustrates formation of a graphene layer atop the starting substrate of FIG. 1;

FIG. 3 illustrates formation of a masking layer atop the graphene layer shown in FIG. 2;

FIG. 4 illustrates a cross-sectional view of the semiconductor device shown in FIG. 3 following an lithography process that patterns the masking layer;

FIG. 5 is a top view of the semiconductor device shown in FIG. 4 illustrating a saw-tooth pattern patterned in the masking layer according to a first embodiment;

FIG. 6 is a top view of the semiconductor device shown in FIG. 4 illustrating a block-pattern patterned in the masking layer according to a second embodiment;

FIG. 7 is a cross-sectional view of the semiconductor device illustrated in FIG. 4 following an etching process to pattern the graphene layer;

FIG. 8 is a top view of the semiconductor device shown in FIG. 7 showing a graphene layer that is patterned according to the first embodiment;

FIG. 9 is a cross-sectional view of the semiconductor device illustrated in FIG. 7 after removing the masking layer to expose graphene electrodes;

FIG. 10 is a top view of the semiconductor device illustrated in FIG. 9 showing the graphene electrodes formed on the substrate according to the first embodiment;

FIG. 11 illustrates the semiconductor device shown in FIG. 9 following solution deposition of carbon nanotubes;

FIG. 12 illustrates the semiconductor device of FIG. 11 showing carbon nanotubes arranged according to an electric field induced in response to applying an electrical voltage and a ground source to the graphene electrodes;

FIG. 13 is a top view of the semiconductor device of FIG. 12 showing an arrangement of the carbon nanotubes between the graphene electrodes according to the first embodiment;

FIG. 14 is a top view of the semiconductor device of FIG. 12 showing arrangement of the carbon nanotubes between the graphene electrodes according to the second embodiment;

FIG. 15 illustrates the semiconductor device of FIG. 12 after disconnecting the electrical voltage and forming a masking layer over the carbon nanotubes;

FIG. 16 is a top view of the semiconductor device of FIG. 15 according to the first embodiment;

FIG. 17 illustrates the semiconductor device of claim 15 following removal of the graphene electrodes to expose the underlying substrate;

FIG. 18 is a top view of the semiconductor device illustrated in FIG. 17;

FIG. 19 illustrates the semiconductor device of FIG. 17 following removal of the masking layer to expose the carbon nanotubes; and FIG. 20 is a top view of the semiconductor device illustrated in FIG. 19 showing an arrangement of the carbon nanotubes on the substrate.

FIGS. 21-24 are a series of views illustrating a semiconductor device including a graphene electrode network to arrange carbon nanotubes, in which:

FIG. 21 illustrates a top view of a semiconductor device including an electrode network etched from a graphene layer formed on a substrate;

FIG. 22 is a top view of the semiconductor device shown in FIG. 21 following solution deposition of carbon nanotubes on the substrate;

FIG. 23 is a top view of the semiconductor device illustrated in FIG. 22 showing alignment of the carbon nanotubes after applying electrical voltage to the graphene electrode network; and FIG. 24 is a top view of the semiconductor device illustrated in FIG. 23 showing arrangement of the carbon nanotubes after disconnected the electrical voltage and removing the graphene electrode network.

DETAILED DESCRIPTION

Figure 1:
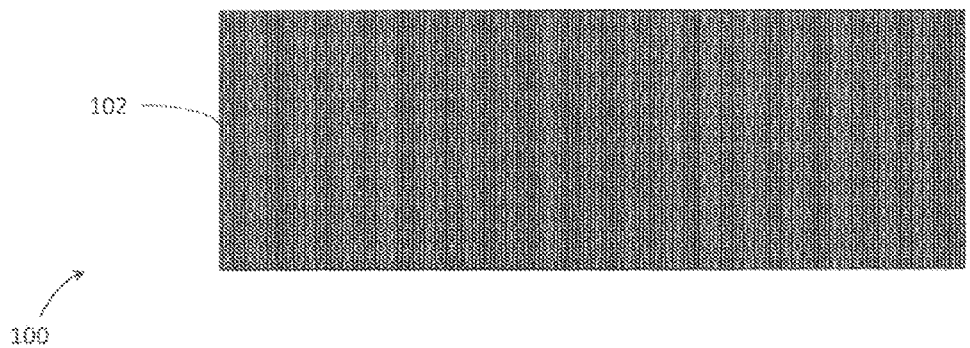

With reference now to FIGS. 1-20, an example of a process flow to form carbon nanotubes on a semiconductor device 100 will be discussed in greater detail. Referring to FIG. 1, a starting substrate 102 utilized to form the semiconductor device 100 is illustrated. The starting substrate 102 may be formed from a variety of materials including, but not limited to, silicon (Si) silicon-carbon (SiC), quartz and plastic. The starting substrate 102 may also be formed as a semiconductor-on-insulator (SOI) substrate. For example, the substrate 102 may comprise an electrical insulating layer interposed between a bulk substrate layer and a semiconductor layer. The electrical insulating layer may include, but is not limited to, silicon dioxide ($SiO_2$), plastic, silicon nitride, silicon oxynitride, a dielectric metal oxide, a dielectric metal oxynitride, glass, organosilicate glass, nitrogen doped organosilicate glass and a combination thereof. The bulk substrate layer and the semiconductor layer may be formed from, for example, silicon (Si). The thickness of the insulator layer may range from about 50 nanometers (nm) to about 2 centimeters (cm).

Figure 2:
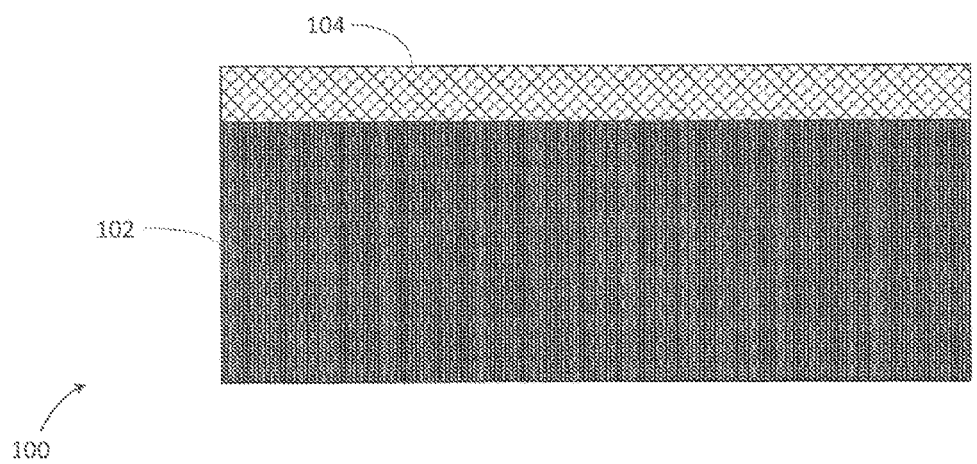

Referring now to FIG. 2, a graphene layer 104 is formed on an exterior surface of the substrate 102. In at least one embodiment, an electrically insulating portion of the substrate 102 is interposed between the graphene layer 104 and a bulk portion of the substrate 102. The electrically insulating portion may be provided as portion of the substrate 102 itself. That is, the insulating portion may be provided as a stand-alone substrate 102 capable of mechanical supporting itself and also structure subsequently formed on the substrate 102. In another embodiment, the insulating portion may be a thin layer that is formed on the exterior portion of the substrate 102 such that the insulating portion is interposed between the graphene layer and the substrate 102.

The graphene layer 104 may be categorized as a semi-metal. That is, although graphene is not a metal, the graphene layer 104 still provides metal-like characteristics, such as electrical conductivity properties comparable to metal. Various methods may be used to form the graphene layer 104 including, but not limited to, diffusion-assisted synthesis, or epitaxially growing the graphene layer 104 on the substrate 102. The graphene layer 104 may be grown as a single graphene layer 104 having a thickness of about 0.34 nm. In another embodiment, the graphene layer 104 may be grown as a plurality of stacked graphene layers 104, each layer having a thickness of about 0.34 nm.

Figure 3:
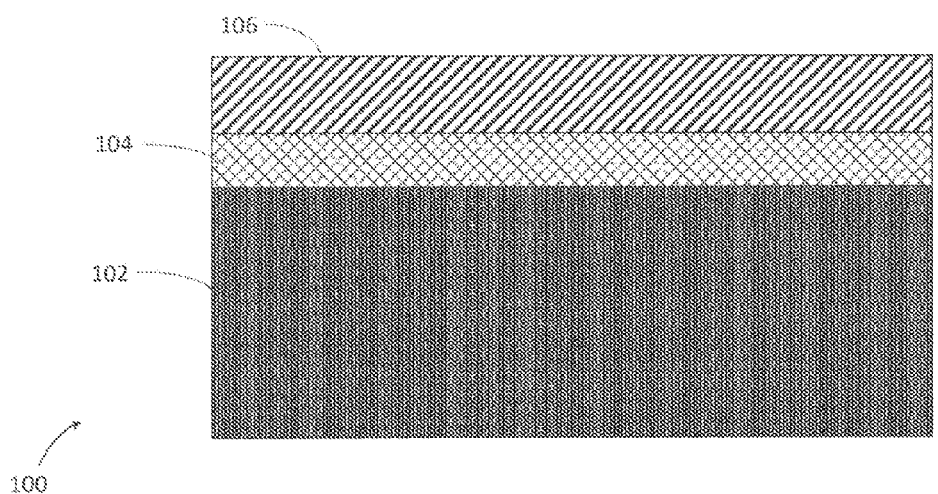

Turning now to FIG. 3, a masking layer 106 is formed atop the graphene layer 104. Accordingly, the graphene layer 104 is interposed between the masking layer 106 and the substrate 102. The masking layer 106 may be a soft masking layer or a hard masking layer. The soft masking layer may include an optical or electron-beam lithography resist such as, for example, poly(methyl methacrylate) (PMMA), hydrogen silsesquioxane (HSQ) or Microposit S1818T™ photoresist material. The hard masking layer may comprise, for example, oxide, nitride, or metal. Various methods may be used to form the masking layer 106 on the graphene layer 104 including, but not limited to, spin coating, compatible deposition, and chemical vapor deposition (CVD). For example, a PMMA material may be developed using an isopropyl alcohol (IPA) and water solution, and may then be spun onto the surface of the graphene layer 104.

Figure 4:
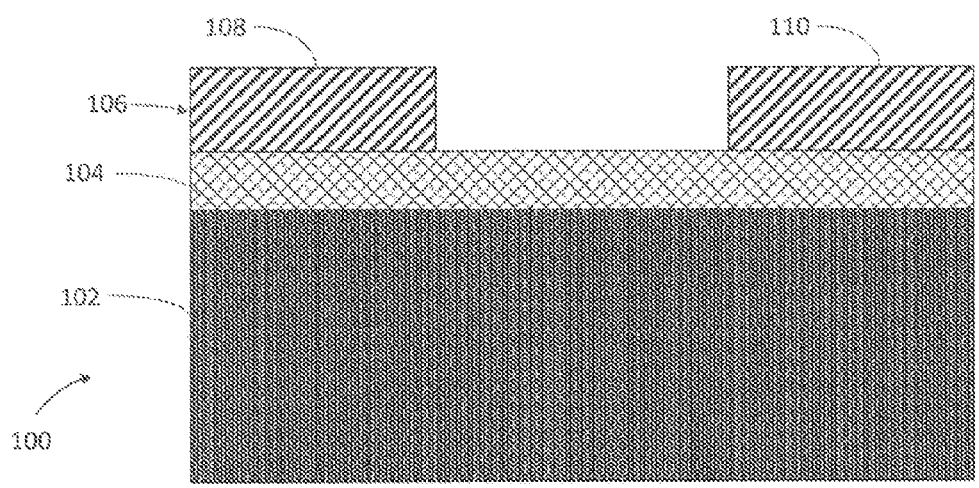

Referring now to FIG. 4, a portion of the masking layer 106 is removed to expose the underlying graphene layer 104. The masking layer 106 may be patterned by impinging an electron beam onto the surface thereof to define a masking pattern. The masking pattern may include various patterns such that the exposed graphene layer 104 is located between a first masking layer portion 108 and an opposing second masking layer portion 110.

Figure 5:
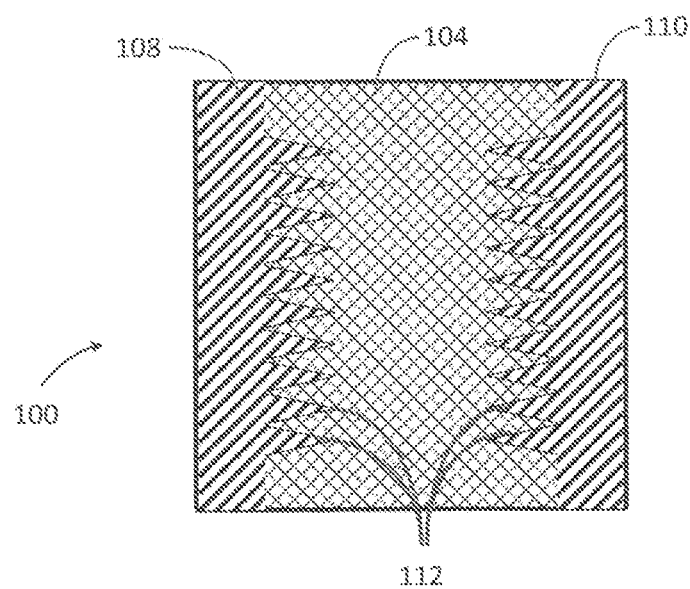
Figure 6:
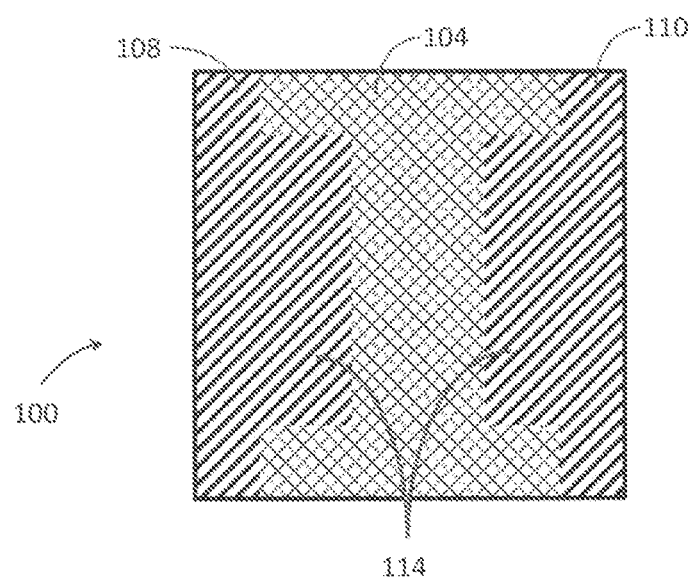

According to a first embodiment, for example, the masking pattern may be a saw-tooth pattern as illustrated in FIG. 5. The saw-tooth pattern includes a plurality of teeth-like portions 112 extending one next to the other along the edge of the masking layer portions 108, 110. The teeth-like portions 112 are separated from one another by a predetermined distance, i.e., pitch. The pitch between each tooth portion may range from about 1 micron (μm) to about 1 nanometer (nm). According to a second embodiment illustrated in FIG. 6, the masking pattern may be a block-pattern. The block-pattern includes uniform-edge portions 114 that define the graphene layer 104 therebetween.

Figure 7:
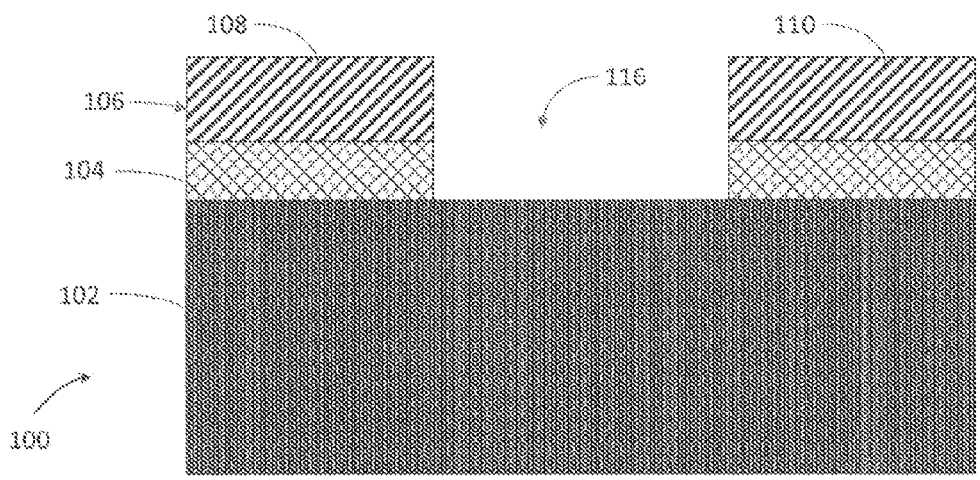
Figure 8:
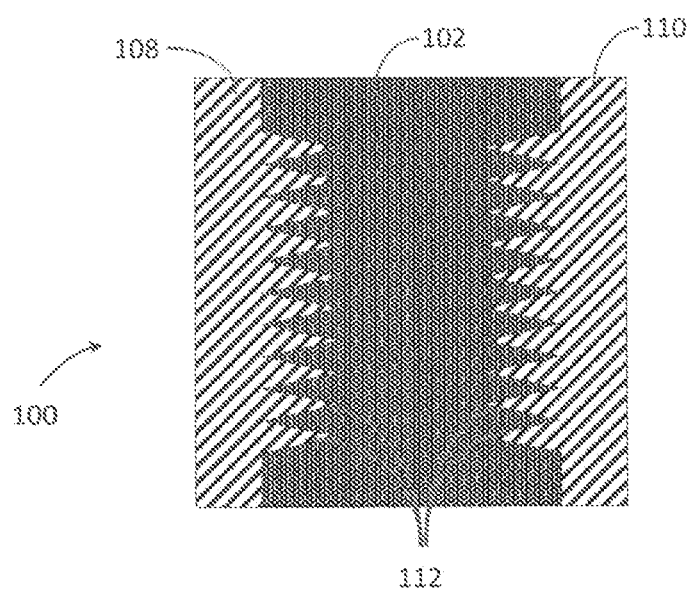

Turning now to FIG. 7, the graphene layer 104 is etched according to the masking pattern as described above. The graphene layer 104 may be etched using an oxygen plasma etching process, for example, thereby exposing a portion of the underlying substrate 102. The exposed substrate 102 is located between the first and second masking layer portions 108, 110 to define a carbon nanotube location area 116, which is discussed in greater detail below. If the saw-tooth masking pattern discussed above is used as the masking pattern, the graphene layer 104 will be etched away such that the underlying substrate 102 is exposed between the teeth-like portions 112 of the remaining masking layer 106 as further illustrated in FIG. 8.

Figure 9:
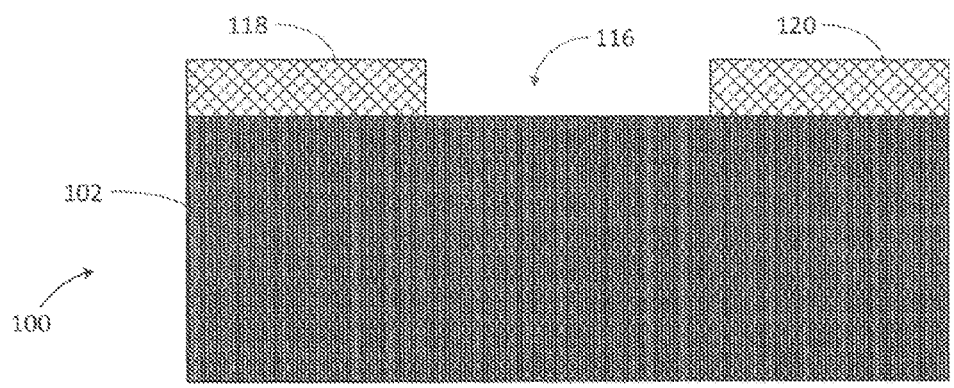

Referring now to FIG. 9, the remaining portion of the masking layer 106 is removed from the graphene layer 104. The masking layer 106 may be lifted from the graphene using, for example, an acetone wash. As a result, a first graphene electrode 118 and a second opposing graphene electrode 120 may be formed on the substrate 102, where the exposed substrate portion is located between the graphene electrodes 118, 120 as further illustrated in FIG. 9.

Figure 10:
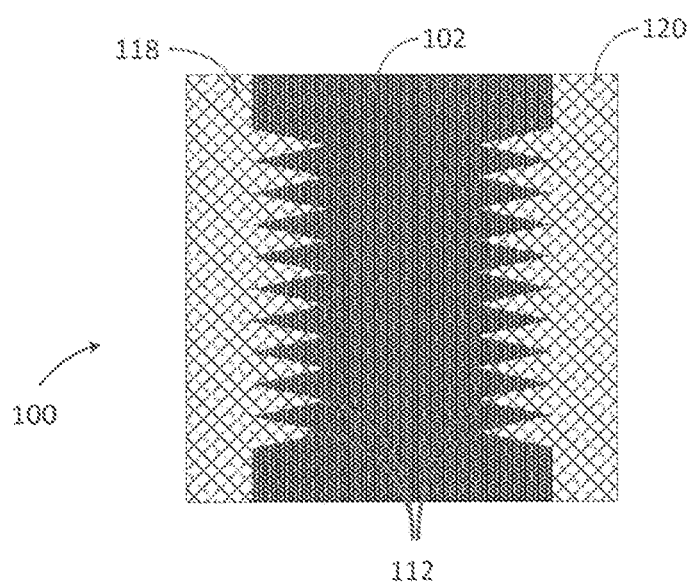

The exposed substrate 102 defines the carbon nanotube location area 116 having a width that extends between the graphene electrodes 118,120, as discussed in greater detail below. The width of the location area 116, i.e., the distance between opposing graphene electrodes 118, 120, may range from about 1 µm to about 1 nm. The graphene electrodes 118, 120 may be patterned according to the graphene and masking-layer etching processes described above. If the saw-tooth masking layer pattern is used, for example, first and second opposing saw-tooth shaped graphene electrodes 118, 120 may be formed as illustrated in FIG. 10. As previously discussed, graphene exhibits electrical conductivity properties such that electrical current is capable of flowing through the graphene electrodes and an electric field 130 may be induced between the graphene electrodes 118, 120.

Figure 11:
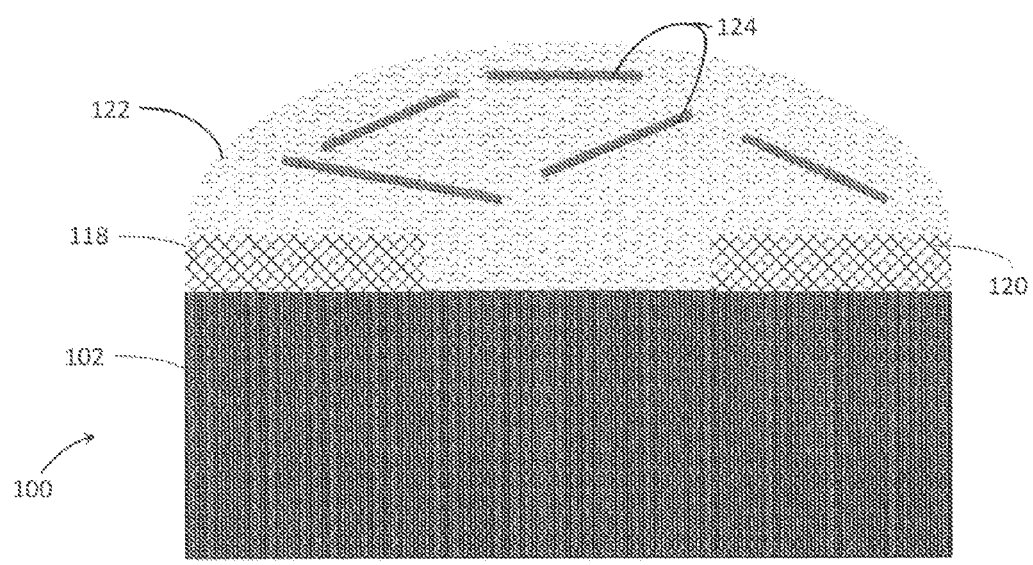

Turning to FIG. 11, a solution 122 containing one or more carbon nanotubes 124 is deposited on the surface of the substrate 102 to cover the graphene electrodes 118, 120. The solution 122 may include an aqueous solution 122 comprising a chromic or nitric acid. The solution 122 may also include an aqueous solution 122 comprising and amphiphilic organic material. The carbon nanotubes 124 are non-uniformly arranged in the solution 122 when they are initially deposited on the substrate 102 as illustrated in FIG. 11. The diameter of the carbon nanotubes 124 may range from about 0.5 nm to about 5 nm.

Figure 12:
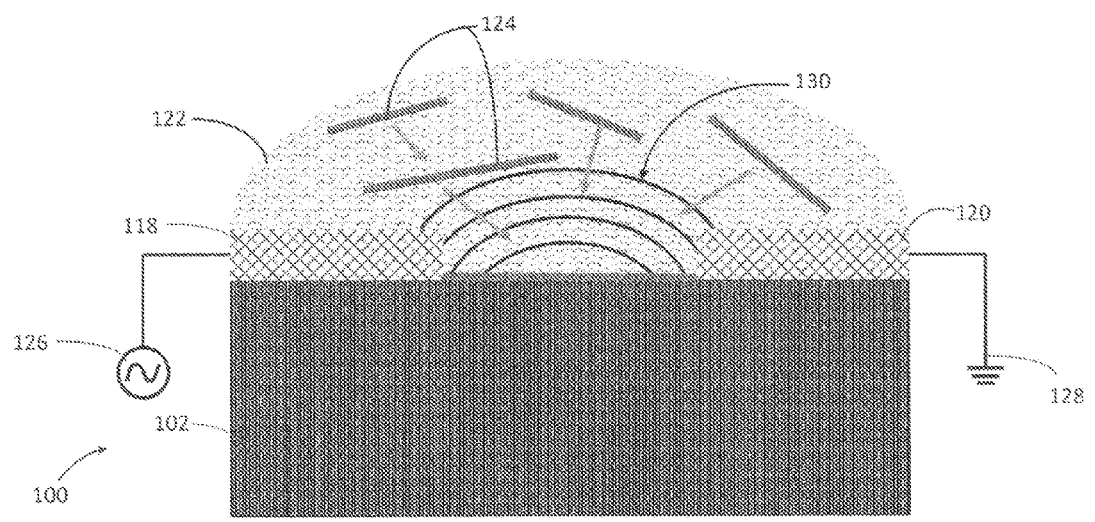

With reference now to FIG. 12, the carbon nanotubes 124 may be forced into alignment with respect to one or more of the graphene electrodes 118, 120 via dielectrophoresis. More specifically, a voltage source 126 may be applied to a first graphene electrode 118 and a ground source 128 may be applied to a second graphene electrode 120 located adjacent and opposite the first graphene electrode 118. The electrical potential across the graphene electrodes 118, 120 induces an electric field 130 between the first and second graphene electrodes 118, 120 as further illustrated in FIG. 12. In at least one embodiment, the voltage source 126 is an alternating current (AC) voltage source 126. Accordingly, the carbon nanotubes 124 become electrically attracted to the electric field 130, thereby moving into the location area 116 between the first and second graphene electrodes via dielectrophoresis. The carbon nanotubes 124 ultimately become aligned between the graphene electrodes 118, 120 according to the direction of the electric field 130.

More specifically, the carbon nanotubes inherently align in a direction parallel to the direction of the electric field 130 extending between the first and second graphene electrodes 118, 120. Accordingly, a first end of the carbon nanotubes 124 is disposed adjacent the first graphene electrode 118 and the opposing end of the carbon nanotube is disposed adjacent the second graphene electrode 120. It is appreciated that the carbon nanotubes 124 may be aligned without requiring physical contact with the first and second graphene electrodes 118, 120. That is, the carbon nanotubes 124 may be aligned with the first and second graphene electrodes 118, 120 exclusively using the electric field 130 without requiring direct contact with the graphene electrodes 118, 120.

Figure 13:
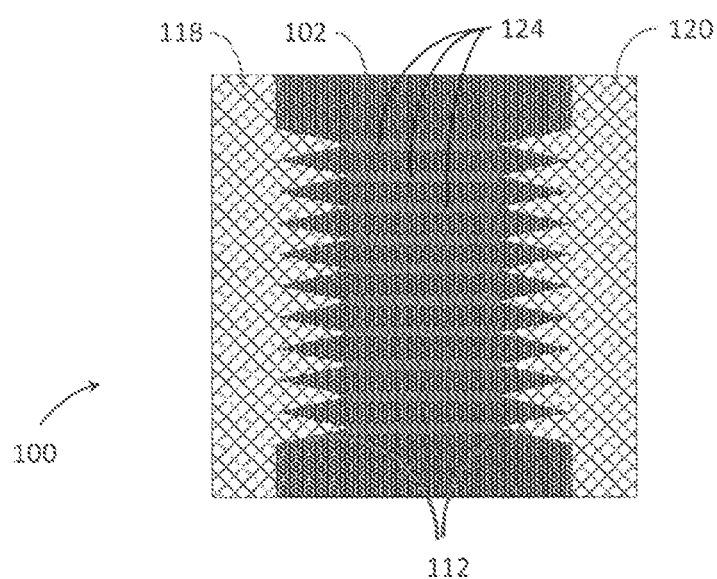
Figure 14:
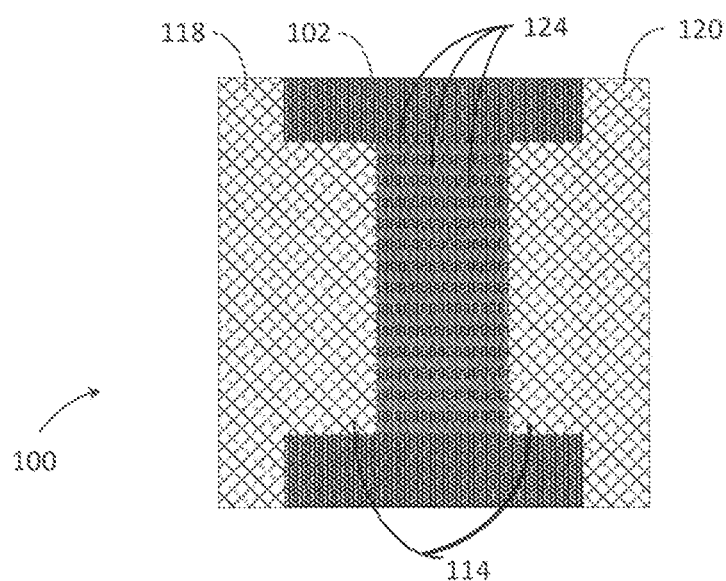

The pattern of the graphene electrodes 118, 120 may also determine the arrangement of the carbon nanotubes 124, thereby allowing for predefined arrangement of carbon nanotube arrays 124 on the substrate 102. Supposing that the graphene electrodes have a saw-tooth pattern, as illustrated in FIG. 13, each carbon nanotube 124 is aligned with respect to ends of opposing teeth-like portions 112. Accordingly, the distance and pitch between each carbon nanotube may be based on the distance between each teeth-like portion 112 of the respective graphene electrode 118, 120, thereby increasing control of the overall arrangement of the nanotubes 124. In addition, the saw-tooth patterned graphene electrodes 118, 120 may assist in confining the electric field 130, thereby providing a more accurate estimation of the electric field distribution between the graphene electrodes 118, 120. Referring to the block-pattern graphene electrodes illustrated in FIG. 14, however, the carbon nanotubes 124 may be arranged in a more condensed manner, i.e., arranged at a closer distance with respect to one another due to the uniform edge portions 114 of the first and second graphene electrodes 118, 120.

Figure 15:
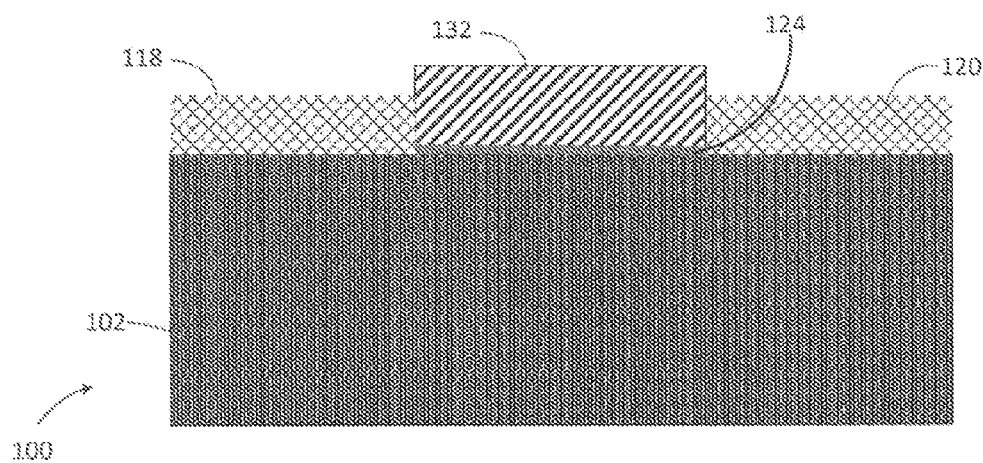
Figure 16:
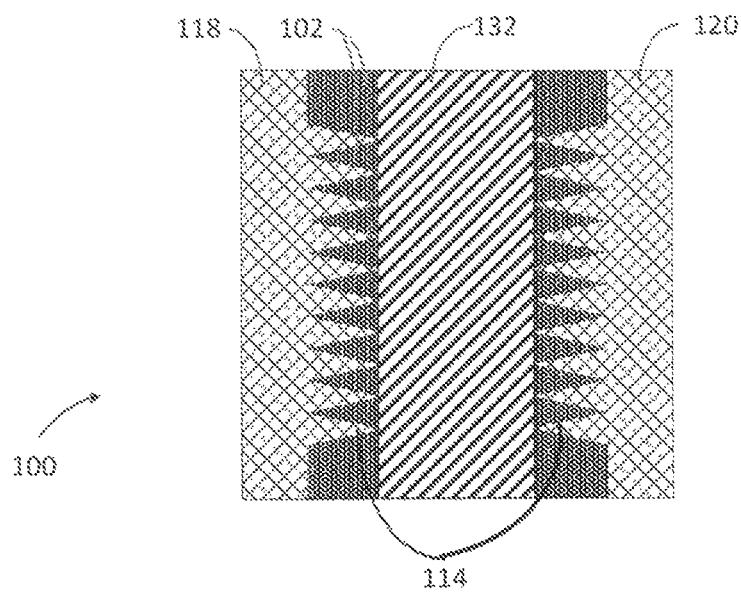

Turning now to FIGS. 15 and 16, the solution 122 may be removed from the substrate 102, for example, by blowing off the solution 122 using a nitrogen flow. In addition, the voltage source 126 and the ground source 128 may be disconnected from the graphene electrodes 118, 120. The carbon nanotubes 124 may then be covered with an auxiliary mask 132 as further illustrated in FIGS. 15 and 16. The auxiliary mask 132 may be formed from material similar to the masking layer 106. For example, the auxiliary mask 132 may be a soft mask or a hard mask. The soft mask may include an optical or electron-beam lithography resist such as, for example, poly (methyl methacrylate) (PMMA), hydrogen silsesquioxane (HSQ) or Microposit S1818™ photoresist material. The hard mask may comprise, for example, oxide, nitride, or metal. Various methods may be used to form the auxiliary mask 132 on the graphene layer 104 including, but not limited to, spin coating, compatible deposition, and chemical vapor deposition (CVD). The auxiliary mask 132 assists in protecting the carbon nanotubes 124 during removal of the graphene electrodes 118, 120, which is discussed in greater detail below.

Figure 17:
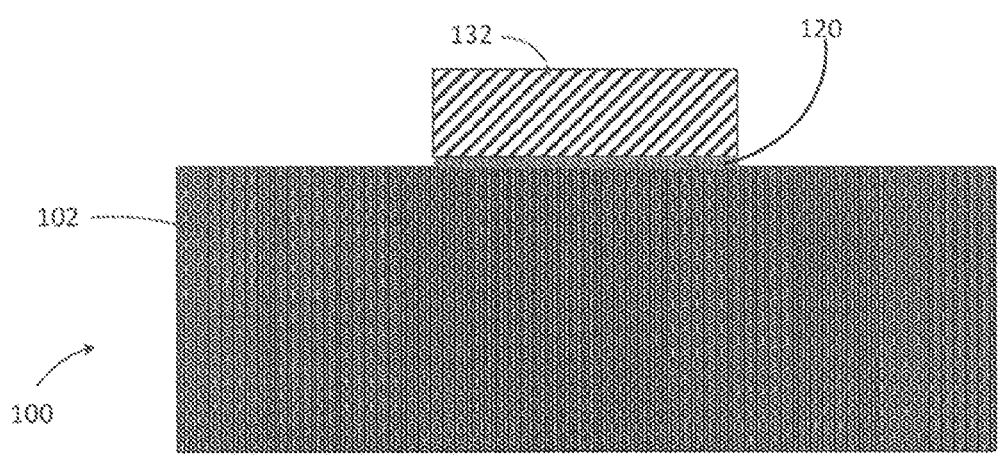
Figure 18:
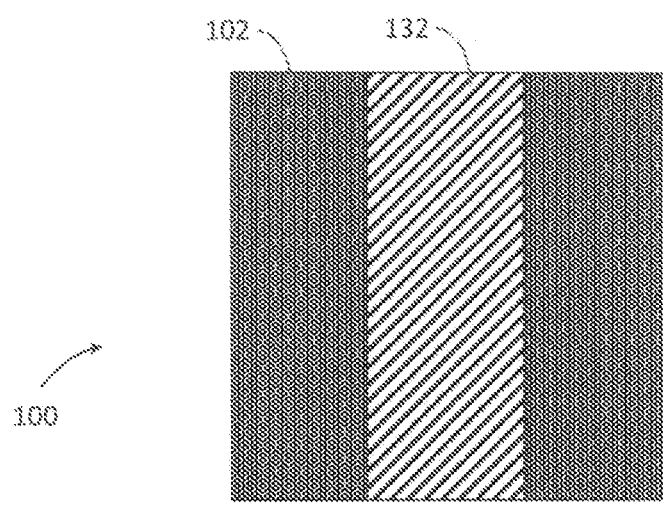
Figure 19:
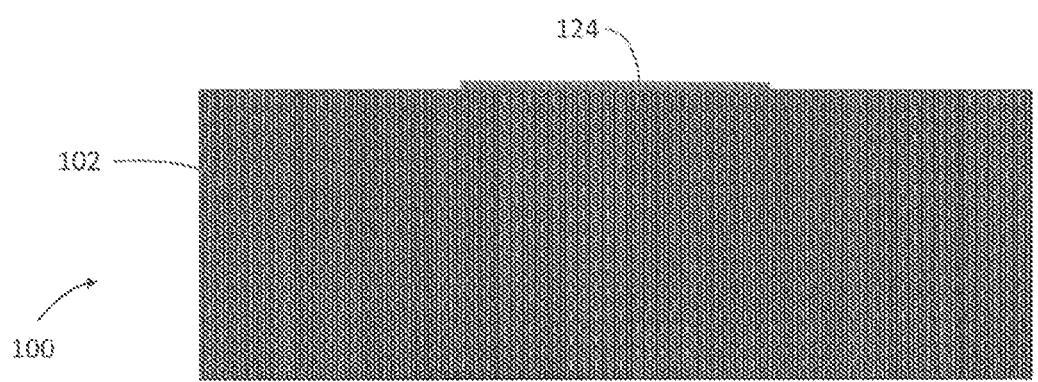
Figure 20:
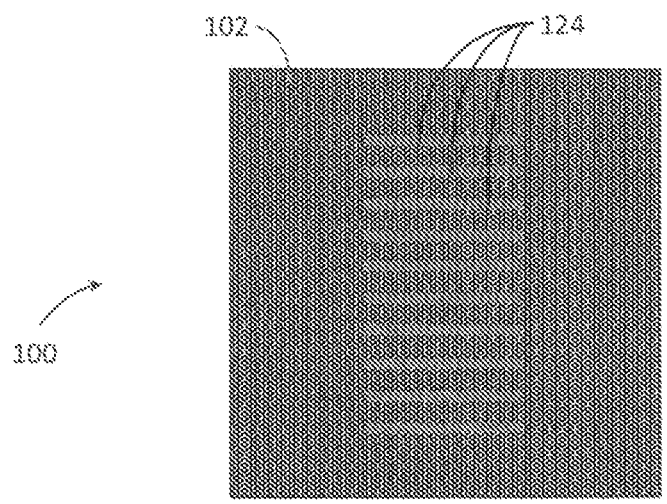

After the auxiliary mask 132 is formed to protect the carbon nanotubes 124, the graphene electrodes 118, 120 are removed from the substrate 102 as illustrated in FIGS. 17 and 18. The first and second graphene electrodes may be removed using, for example, an oxygen plasma etching process. The axillary mask 132 may be removed using, for example, an acetone wash, thereby leaving one or more carbon nanotubes 124 formed on the substrate 102 according to a predefined arrangement and alignment as shown in FIGS. 19 and 20. The substrate 102 having the arranged carbon nanotubes 124 may subsequently be used for further device processing according to a desired semiconductor device 100 application.

Figure 21:
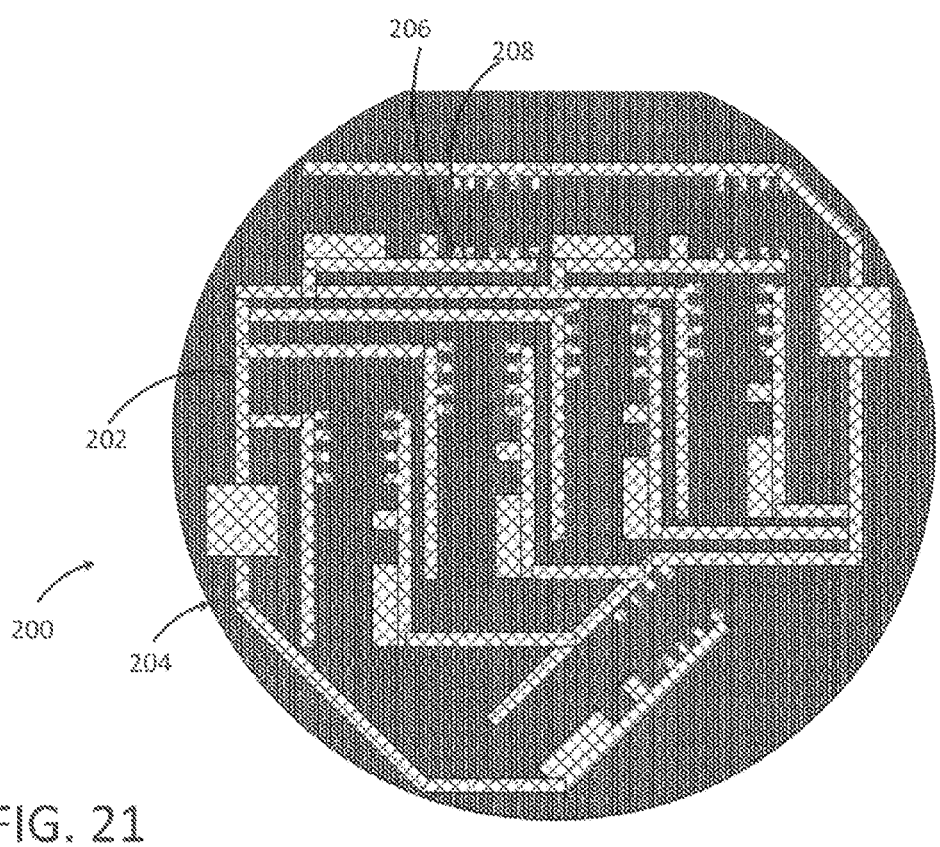

Turning now to FIGS. 21-24, a series of views illustrating a semiconductor device including a graphene electrode network to arrange carbon nanotubes is shown according to an embodiment. Referring to FIG. 21, a top view of a semiconductor device 200 is shown. The semiconductor device 200 includes a graphene electrode network 202 etched from a graphene layer formed on a substrate wafer 204. The graphene electrode network 202 includes a plurality of graphene electrode branches. The graphene electrode branches may include one or more electrode pairs. Each graphene electrode pair includes a first electrode 206 and an opposing second electrode 208. The substrate wafer 204 may be formed from a variety of materials including, but not limited to, silicon (Si) silicon-carbon (SiC), quartz and plastic. The substrate wafer 204 may include an electrically insulation portion or layer integrally formed therewith. In at least one exemplary embodiment, the substrate wafer 204 may also be formed as a semiconductor-on-insulator (SOI) substrate. The SOI substrate may include an insulation layer interposed between a bulk portion of the substrate and an upper surface of the substrate.

Figure 22:
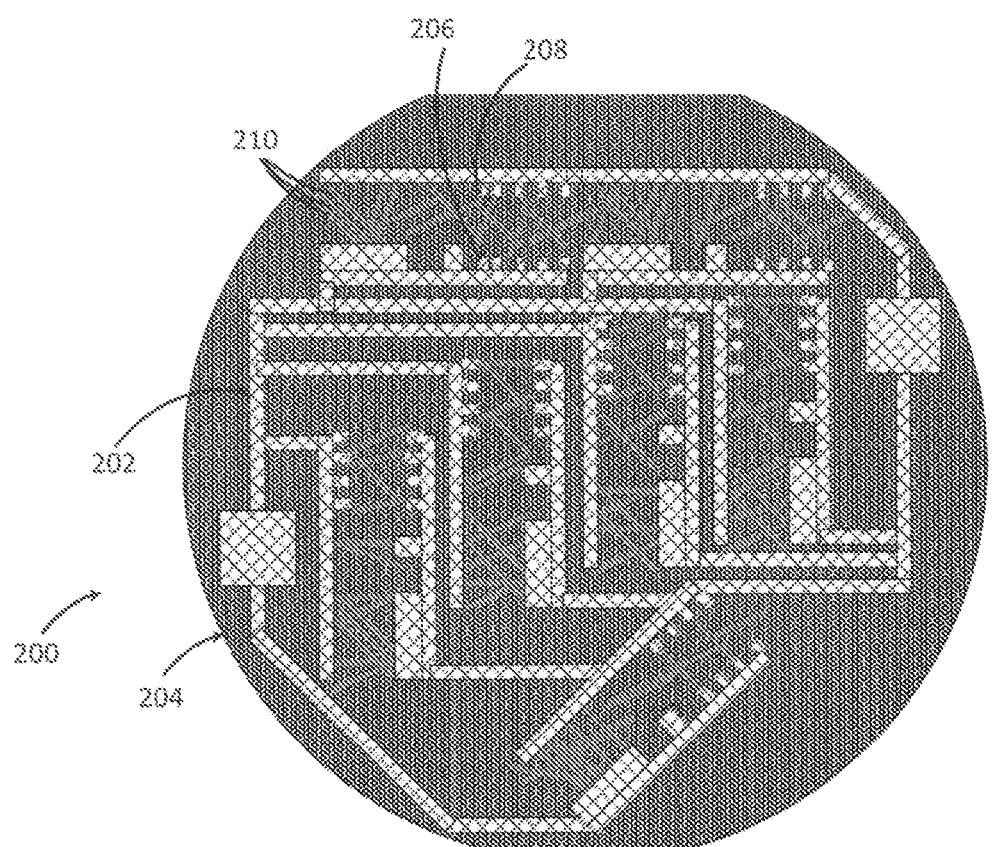
Figure 23:
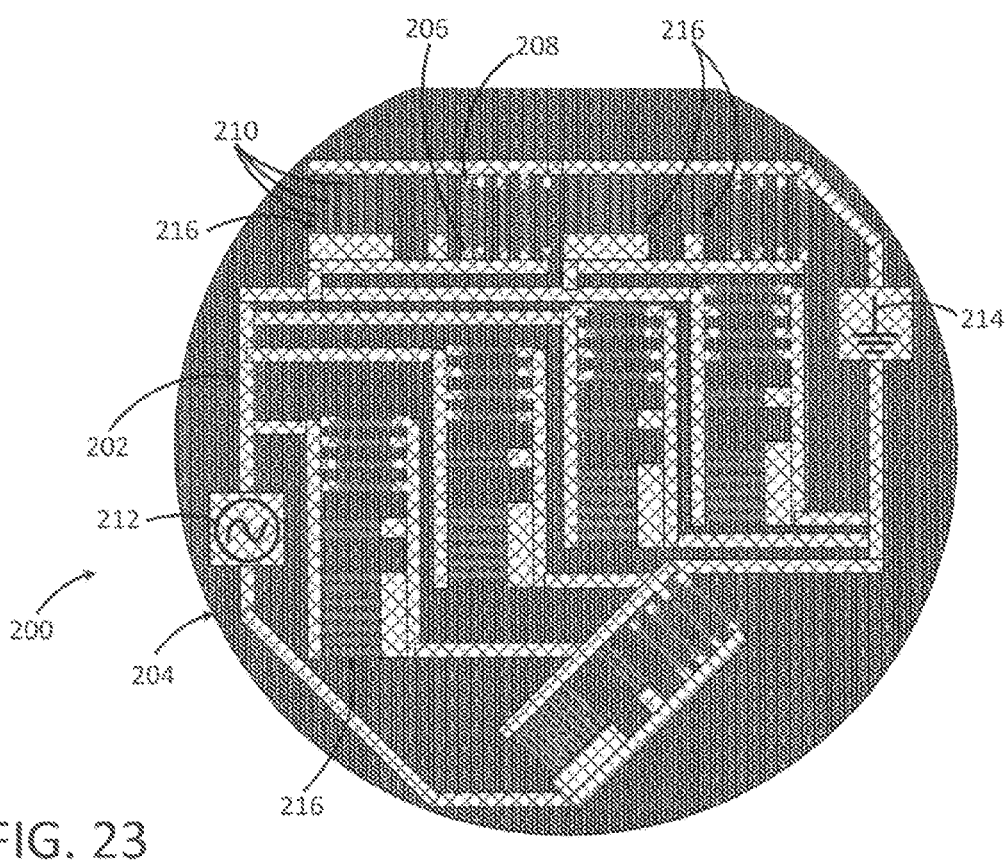
Figure 24:
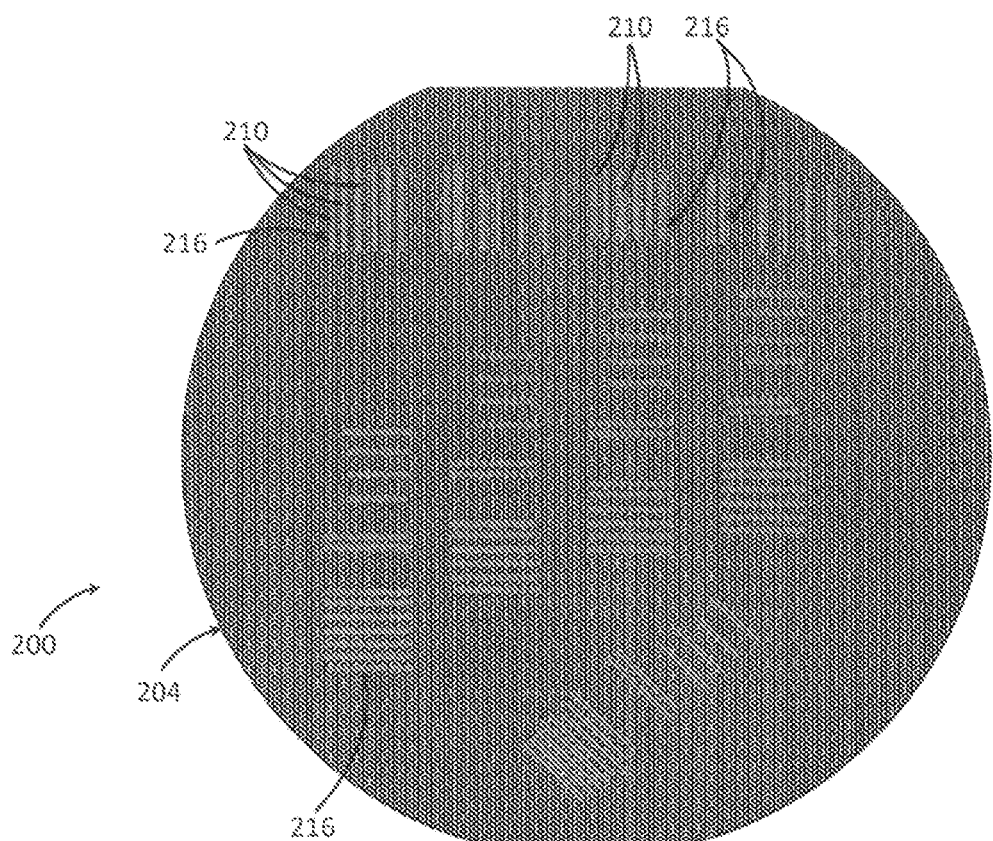

Turning to FIG. 22, the semiconductor device 200 of FIG. 21 is shown after randomly depositing carbon nanotubes 210 on the substrate wafer 204. As discussed in detail above, the carbon nanotubes 210 may be contained in a solution that is deposited on the substrate wafer 204. After depositing the carbon nanotubes 210, a voltage source 212 and a ground source 214 may be electrically connected to the graphene electrode network 202, as illustrated in FIG. 23. In at least one embodiment, a first plurality of electrode branches may be commonly connected to a voltage source 212, while a second electrode branch may be commonly connected to a ground source 214. The voltage 212 and ground 214 connections induce an electric field between the graphene electrode pairs as discussed in detail above. Accordingly, the carbon nanotubes 210 are forced into alignment between the opposing graphene electrode pairs 206, 208 to provide one or more carbon nanotube arrays 216 as further illustrated in FIG. 23. Each carbon nanotube array 216 may comprise a plurality of individual carbon nanotubes 210. After aligning the carbon nanotubes 210, the voltage source 212, ground source 214 and graphene electrode network 202 may be removed. A substrate wafer 204 is then having a plurality of carbon nanotube arrays 216 arranged according to the predefined arrangement and alignment set by the graphene electrode network 202, as illustrated in FIG. 24.

Figure 25:
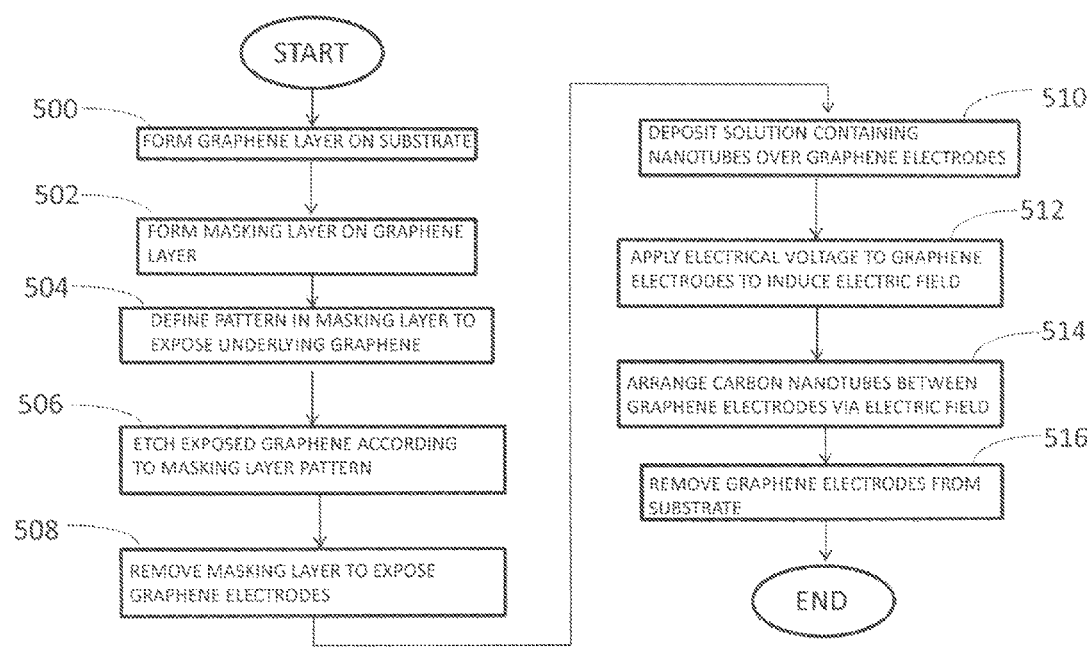
FIG. 25 is a flow diagram illustrating a method of forming carbon nanotubes on a semiconductor device according to an embodiment.

Referring now to FIG. 25, a flow diagram illustrates a method of forming carbon nanotubes on a semiconductor device according to an embodiment. At operation 500, a graphene layer is formed on a substrate. The graphene layer may be formed, for example, by epitaxial growing the graphene layer on an exterior surface of the substrate. At operation 502, a masking layer is formed on the graphene layer. In at least one embodiment, the masking layer may be spun the graphene layer. The masking layer may be defined using, for example, an electron beam to expose a portion of underlying graphene layer at operation 504. At operation 506, the exposed graphene layer is etched according to the patterned masking layer to expose a portion of the underlying substrate. The patterned graphene layer defines a carbon nanotube location area to receive one or more carbon nanotubes. At operation 508, the remaining masking layer is removed using, for example, an acetone wash, thereby exposing opposing graphene electrodes. The opposing graphene electrodes may be separated from one another by the exposed substrate, i.e., the carbon nanotube location area.

A solution containing randomly arranged carbon nanotubes is deposited on the substrate to cover the graphene electrodes at operation 510. At operation 512, a voltage source is electrically connected to a first graphene electrode and a ground source is electrically connected to the opposing second graphene electrode. In response to connecting the voltage and ground sources, an electric field is induced between the opposing graphene electrodes. At operation 514, the carbon nanotubes are induced into alignment between the opposing graphene electrodes via the electric field. After the carbon nanotubes are aligned, the graphene electrodes are removed from the substrate at operation 516, and the method ends. It is appreciated that a mask may be formed over the carbon nanotubes to protect the nanotubes during removal of the graphene electrodes. The graphene electrodes may be removed using an oxygen plasma etching process, and the mask may be removed using an acetone wash. Accordingly, the carbon nanotubes are left remaining on the substrate according to a predefined arrangement and alignment such that the semiconductor device may be further utilized in a subsequent process flow, for example, subsequent transistor fabrication.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the invention in the form disclosed. Many modifications and variations will be apparent to those of ordinary skill in the art without departing from the scope and spirit of the claims. Various embodiments were chosen and described in order to best explain the principles of the inventive concept and the practical application, and to enable others of ordinary skill in the art to understand various embodiments with various modifications as are suited to the particular use contemplated The flow diagrams depicted herein are just one example. There may be many variations to this diagram or operations described therein without departing from the scope of the claims. For instance, operations may be performed in a differing order, added, deleted or modified. All of these variations are considered a part of the claimed invention.

While the preferred embodiment to the invention had been described, it will be understood that those skilled in the art, both now and in the future, may make various modifications which fall within the scope of the following claims. These claims should be construed to maintain the proper protection for the invention first described.

What is claimed is:

1. A method of forming carbon nanotubes on a substrate, the method comprising:
    forming a pair of graphene electrodes on a surface of the substrate, the pair of graphene electrodes separated from one another by an exposed portion of the substrate to define a first graphene electrode and a second graphene electrode opposite the first graphene electrode;
    depositing a solution containing at least one carbon nanotube on the surface of the substrate, the solution covering the first and second graphene electrodes; and
    generating an electric field across the first and second graphene electrodes, the electric field forcing the carbon nanotubes to the exposed portion of the substrate and aligning the at least one carbon nanotube between the first and second graphene electrodes in a direction parallel with the electric field.

2. The method of claim 1, further comprising removing the first and second electrodes from the substrate while maintaining the at least one carbon in the alignment induced by the electric field.

3. The method of claim 2, wherein the forming the pair of graphene electrodes further comprises:

forming a graphene layer on the substrate;

forming a masking layer on the graphene layer;

defining the masking layer and the graphene layer according to a pattern that forms the exposed portion of the substrate between first and second masking layer portions of the masking layer; and removing the first and second masking layer portions to expose the first and second graphene electrodes, the first and second graphene electrodes patterned according to the etching applied to the masking layer and graphene layer.

4. The method of claim 3, further comprising forming a uniform portion at the edge of the first and second graphene electrodes, the uniform portion extending in a uniformed direction between ends of the edge.

5. The method of claim 4, positioning the at least one carbon nanotube between the edge of the first and second graphene electrodes via the electric field.

6. The method of claim 3, further comprising forming a plurality of teeth-like portions at the edge of the first and second graphene electrodes.

7. The method of claim 6, further comprising aligning a first end of the at least one nanotube adjacent a first teeth-like portion of the first graphene electrode and aligning a second end of the at least one nanotube adjacent a second teeth-like portion of the second graphene electrode located directly opposite from the first teeth-like portion.

8. The method of claim 3, further comprising forming the substrate from an electrically insulating material.

9. The method of claim 8, further comprising interposed an insulating layer between the graphene layer and the substrate.

10. The method of claim 9, wherein the generating the electric field further comprises applying a voltage source to the first graphene electrode and applying a ground source to the second graphene electrode.

11. The method of claim 10, wherein the voltage source is an alternating current (AC) voltage source.

* * * * *